US008980077B2

(12) United States Patent
Romer et al.

(10) Patent No.: US 8,980,077 B2
(45) Date of Patent: Mar. 17, 2015

(54) PLATING BATH AND METHOD

(75) Inventors: Duane R. Romer, Midland, MI (US); Elissei Iagodkine, Marlborough, MA (US); Inho Lee, Southborough, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 321 days.

(21) Appl. No.: 13/435,683

(22) Filed: Mar. 30, 2012

(65) Prior Publication Data

US 2013/0256145 A1 Oct. 3, 2013

(51) Int. Cl.
C25D 3/46 (2006.01)
C25D 3/64 (2006.01)
C23C 18/42 (2006.01)
C23C 18/48 (2006.01)

(52) U.S. Cl.
CPC . *C25D 3/46* (2013.01); *C23C 18/48* (2013.01); *C25D 3/64* (2013.01); *C23C 18/42* (2013.01)
USPC .......................... 205/238; 205/242; 106/1.26

(58) Field of Classification Search
CPC ............ C25D 3/46; C25D 3/64; C23C 18/42; C23C 18/48
USPC ................... 205/238, 242; 106/1.26
See application file for complete search history.

(56) References Cited

U.S. PATENT DOCUMENTS

| 5,256,275 | A | 10/1993 | Brasch |
| 5,911,866 | A | 6/1999 | Oshima et al. |
| 5,972,875 | A * | 10/1999 | Crutcher et al. ............... 510/421 |
| 6,099,713 | A | 8/2000 | Yanada et al. |
| 6,210,556 | B1 | 4/2001 | Toben et al. |
| 6,607,653 | B1 | 8/2003 | Tsuji et al. |
| 6,923,875 | B2 | 8/2005 | Ikeda et al. |
| 6,998,036 | B2 | 2/2006 | Dietterle et al. |
| 7,122,108 | B2 | 10/2006 | Heber et al. |
| 7,465,385 | B2 | 12/2008 | Egli et al. |
| 7,628,903 | B1 * | 12/2009 | Tsuji et al. .................... 205/239 |
| 7,968,444 | B2 * | 6/2011 | Luo et al. ....................... 438/597 |

FOREIGN PATENT DOCUMENTS

| JP | 09-143786 A | 11/1995 | |
| JP | 2000192279 A | 7/2000 | |
| JP | 2007046142 A | 2/2002 | |
| JP | 2006265572 A | 10/2006 | |
| JP | 2007046142 A * | 2/2007 | ............... C25D 3/46 |

OTHER PUBLICATIONS

Bellaart et al., "3,6-Dithiaoctane-1,8-Dicarboxylic Acid and Its Metal Complexes", Inorganic and Nuclear Chemistry Letters (no month, 1969), vol. 5, No. 12, pp. 1005-1007.*
Bellaart et al., "Metal Complexes of 4,7-Dithiadecane-1,10-Dicarboxylic Acid and Allied Compounds", Z. Anorg. Allg. Chem. (no month, 1975), vol. 412, pp. 155-160.*
Correspondence received in connection with corresponding Japanese Application No. 2013-067757 regarding a third party submission provided to the Japanese Patent Office on Mar. 31, 2014.

* cited by examiner

*Primary Examiner* — Edna Wong
(74) *Attorney, Agent, or Firm* — S. Matthew Cairns

(57) ABSTRACT

Silver electroplating baths having certain sulfide compounds and methods of electrodepositing a silver-containing layer using these baths are disclosed. Such electroplating baths are useful to provide silver-containing solder deposits having reduced void formation and improved within-die uniformity.

10 Claims, No Drawings

PLATING BATH AND METHOD

The present invention relates generally to the field of electrolytic metal plating. In particular, the present invention relates to the field of electrolytic tin-alloy plating.

Metals and metal-alloys are commercially important, particularly in the electronics industry where they are often used as electrical contacts, final finishes and solders. The use of tin-lead, once the most common tin-alloy solder, has declined due to the increasing restrictions on lead. Lead-free alloys, such as tin-silver, tin-copper, tin-bismuth, tin-silver-copper, and others, are common replacements for tin-lead solders. These solders are often deposited on a substrate using a plating bath, such as an electroplating bath.

Methods for electroplating articles with metal coatings generally involve passing a current between two electrodes in a plating solution where one of the electrodes (typically the cathode) is the article to be plated. A typical silver or silver-alloy plating solution comprises dissolved silver ion, water, optionally one or more dissolved alloying metals such as tin or copper, an acid electrolyte such as methanesulfonic acid in an amount sufficient to impart conductivity to the bath, and proprietary additives to improve the uniformity of the plating and the quality of the metal deposit. Such additives include complexers, surfactants, and grain refiners, among others.

U.S. Pat. No. 6,998,036 discloses an acidic tin-silver alloy electroplating bath containing a certain sulfide or thiol-substituted ether compound. The only exemplified compound, 3,6-dithiaoctanediol-1,8, has been found to polymerize upon extended storage or long term use, resulting in precipitation of silver from the electroplating bath.

U.S. Pat. No. 7,628,903 discloses conventional silver and silver-alloy electroplating baths containing certain sulfide compounds. This patent purports that these electroplating baths have good stability. However, it has been found that upon extended storage or long-term use, such sulfide compounds polymerize or decompose in a tin-silver electroplating bath, resulting in precipitation of silver from the electroplating bath.

There remains a need for silver and silver-alloy electroplating baths, particularly tin-silver alloy electroplating baths, that have sufficient stability upon storage and long-term use and provide tin-silver alloy deposits that meet solder performance criteria in various applications.

The present invention provides an electroplating composition comprising: a bath-soluble source of silver ions; water; acid electrolyte; and a sulfide compound of the formula:

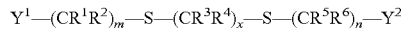

wherein $Y^1$ and $Y^2$ are independently chosen from $CO_2H$, $SO_3H$, $PO_3H_2$, $CONR^7R^8$ and OH; each $R^1$, $R^2$, $R^5$ and $R^6$ is independently chosen from H, $(C_1\text{-}C_6)$alkyl, $CO_2H$, and hydroxy-substituted $(C_1\text{-}C_6)$alkyl; each $R^3$ and $R^4$ is independently chosen from H and $(C_1\text{-}C_6)$alkyl; m=1-6; n=1-6; $R^7$ and $R^8$ are independently chosen from H and $(C_1\text{-}C_3)$alkyl; and x=1-6; provided that when $Y^1$=OH, m=3; provided that when $Y^2$=OH, n=3; and provided that when any of $R^1$, $R^2$, $R^5$ and $R^6$ is hydroxy-substituted $(C_1\text{-}C_6)$alkyl, the hydroxy group is bonded to a carbon atom that is at least gamma to a sulfur atom. Such electroplating composition may further include one or more alloying metals and one or more adjuvants.

Also provided by the present invention is a method of depositing a silver or silver-alloy layer on a substrate comprising: contacting a substrate with an electroplating composition comprising: a bath-soluble source of silver ions; water; acid electrolyte; and sulfide compound of the formula: $Y^1$—$(CR^1R^2)_m$—S—$(CR^3R^4)_x$—S—$(CR^5R^6)_n$—$Y^2$ wherein $Y^1$ and $Y^2$ are independently chosen from $CO_2H$, $SO_3H$, $PO_3H_2$, $CONR^7R^8$ and OH; each $R^1$, $R^2$, $R^5$ and $R^6$ is independently chosen from H, $(C_1\text{-}C_6)$alkyl, $CO_2H$, and hydroxy-substituted $(C_1\text{-}C_6)$alkyl; each $R^3$ and $R^4$ is independently chosen from H and $(C_1\text{-}C_6)$alkyl; m=1-6; n=1-6; $R^7$ and $R^8$ are independently chosen from H and $(C_1\text{-}C_3)$alkyl; and x=1-6; provided that when $Y^1$=OH, m=3; provided that when $Y^2$=OH, n=3; and provided that when any of $R^1$, $R^2$, $R^5$ and $R^6$ is hydroxy-substituted $(C_1\text{-}C_6)$alkyl, the hydroxy group is bonded to a carbon atom that is at least gamma to a sulfur atom; and applying a potential for a period of time to deposit a tin-silver-containing layer on the substrate.

As used throughout this specification, the following abbreviations shall have the following meanings, unless the context clearly indicates otherwise: ASD=$A/dm^2$=amperes per square decimeter; ° C.=degrees Centigrade; g=gram; mg=milligram; L=liter; Å=angstroms; μm=microns=micrometers; mm=millimeters; min=minutes; DI=deionized; and mL=milliliter. All amounts are percent by weight ("wt %") and all ratios are molar ratios, unless otherwise noted. All numerical ranges are inclusive and combinable in any order, except where it is clear that such numerical ranges are constrained to add up to 100%.

As used throughout this specification, the term "plating" refers to metal electroplating. "Deposition" and "plating" are used interchangeably throughout this specification. "Halide" refers to chloride, bromide, iodide and fluoride. The articles "a" and "an" refer to the singular and the plural. "Alkyl" refers to linear, branched and cyclic alkyl. "Aryl" refers to aromatic carbocycles and aromatic heterocycles.

It has been surprisingly found that the use of a sulfide compound of the formula:

wherein $Y^1$ and $Y^2$ are independently chosen from $CO_2H$, $SO_3H$, $PO_3H_2$, $CONR^7R^8$ and OH; each $R^1$, $R^2$, $R^5$ and $R^6$ is independently chosen from H, $(C_1\text{-}C_6)$alkyl, $CO_2H$, and hydroxy-substituted $(C_1\text{-}C_6)$alkyl; each $R^3$ and $R^4$ is independently chosen from H and $(C_1\text{-}C_6)$alkyl; m=1-6; n=1-6; $R^7$ and $R^8$ are independently chosen from H and $(C_1\text{-}C_3)$alkyl; and x=1-6; provided that when $Y^1$=OH, m=3; provided that when $Y^2$=OH, n=3; and provided that when any of $R^1$, $R^2$, $R^5$ and $R^6$ is hydroxy-substituted $(C_1\text{-}C_6)$alkyl, the hydroxy group is bonded to a carbon atom that is at least gamma to a sulfur atom, in a silver or silver-alloy electroplating bath improves stability of the electroplating bath. Such sulfide compounds function as complexers in the silver electroplating bath.

Any substrate upon which a silver or silver-containing alloy can be electroplated is useful in the present invention. Such substrates include, but are not limited to, electronic devices such as printed wiring boards, lead frames, interconnects and semiconductive substrates. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated. As used herein, the term "wafer" is intended to encompass "a substrate," "a semiconductor substrate," "a semiconductor device," and various packages for various levels of interconnection, including a single-chip wafer, multiple-chip wafer, packages for various levels, or other assemblies requiring solder connections. Particularly suitable substrates are patterned wafers, such as patterned silicon wafers and patterned gallium-arsenide wafers. Such wafers may be any suitable size. Preferred wafer diameters are 200 mm to 300 mm, although wafers having smaller and larger diameters may be electroplated according to the present invention.

Any bath-soluble source of silver ions may be used in the present electroplating baths. As used herein, the term "bath-soluble" source of metal ions refers to a source of metal ions that is soluble in the present acid electroplating bath. Examples of suitable silver compounds include, but are not limited to, silver oxide, silver nitrate, silver alkanesulfonate, silver arylsulfonate, silver iodide, silver chloride, and silver sulfate. Silver oxide and silver methane sulfonate are preferred. Mixtures of bath-soluble silver compounds may be used.

A wide range of amounts of bath-soluble silver compound may be used in the present electroplating baths, depending on the amount of silver desired in the deposit. The choice of such an amount of silver compound is within the ability of one skilled in the art. A suitable range of silver concentration in the electroplating bath is from 0.05 to 50 g/L of silver. Electroplating baths for depositing silver may contain from 20 to 50 g/L of silver. Silver-alloy electroplating baths may contain varying amounts of silver, such as from 0.1 to 25 g/L, depending upon the particular silver-alloy to be deposited. For example, when silver alloys, such as tin-silver, having from 0.1 to 10 wt % silver are desired, exemplary concentrations of silver in the present electroplating baths may range from 0.05 to 10 g/L, preferably from 0.1 to 10 g/L, more preferably from 0.1 to 8 g/L, and even more preferably from 0.1 to 5 g/L. For high speed processes, a suitable concentration of silver is from 0.5 to 8 g/L.

Any acid electrolyte that is bath-soluble and does not otherwise adversely affect the electrolyte composition may be used in the present invention. Suitable acid electrolytes include, but are not limited to: alkanesulfonic acids, such as methanesulfonic acid, ethanesulfonic acid and propanesulfonic acid; arylsulfonic acids such as phenylsulfonic acid, toluenesulfonic acid, phenolsulfonic acid, and cresolsulfonic acid; sulfuric acid; sulfamic acid; and mineral acids such as, hydrochloric acid, hydrobromic acid and fluoroboric acid. Alkanesulfonic acids and arylsulfonic acids are preferred acid electrolytes, and alkanesulfonic acids are more preferred. Methanesulfonic acid is particularly preferred. Mixtures of acid electrolytes are particularly useful, such as, but not limited to, mixtures of alkane sulfonic acids and sulfuric acid. Thus, more than one acid electrolyte may be used advantageously in the present invention. The acidic electrolytes useful in the present invention are generally commercially available and may be used without further purification. Alternatively, the acid electrolytes may be prepared by methods known in the literature. Typically, the amount of acid electrolyte in the present electroplating baths is in the range of 10 to 400 g/L, preferably from 100 to 400 g/L, and more preferably from 150 to 350 g/L.

The present silver or silver-alloy electroplating baths contain one or more sulfide compounds of the formula: $Y^1$—$(CR^1R^2)_m$—S—$(CR^3R^4)_x$—S—$(CR^5R^6)_n$—$Y^2$ wherein $Y^1$ and $Y^2$ are independently chosen from $CO_2H$, $SO_3H$, $PO_3H_2$, $CONR^7R^8$ and OH; each $R^1$, $R^2$, $R^5$ and $R^6$ is independently chosen from H, $(C_1-C_6)$alkyl, $CO_2H$, and hydroxy-substituted $(C_1-C_6)$alkyl; each $R^3$ and $R^4$ is independently chosen from H and $(C_1-C_6)$alkyl; m=1-6; n=1-6; $R^7$ and $R^8$ are independently chosen from H and $(C_1-C_3)$alkyl; and x=1-6; provided that when $Y^1$=OH, m=3; provided that when $Y^2$=OH, n=3; and provided that when any of $R^1$, $R^2$, $R^5$ and $R^6$ is hydroxy-substituted $(C_1-C_6)$alkyl, the hydroxy group is bonded to a carbon atom that is at least gamma to a sulfur atom. The phrase "the hydroxy group is bonded to a carbon atom at least gamma to a sulfur atom" refers to a hydroxyl group that is 3 carbons or more away from the sulfur atom. That is, the hydroxyl group may be 3, 4, 5, 6, 7, 8, 9, or 10 carbons away from the sulfur atom, preferably 3, 4, 5, 6, 7, or 8 carbons away from the sulfur atom, more preferably 3, 4, 5, or 6 carbons away from the sulfur atom, and most preferably 3 carbons away from the sulfur atom. Preferably, each $R^1$, $R^2$, $R^5$ and $R^6$ is independently chosen from H, $(C_1-C_4)$alkyl, $CO_2H$, and hydroxy-substituted $(C_1-C_4)$alkyl, more preferably from H, $(C_1-C_4)$alkyl, and hydroxy-substituted $(C_1-C_2)$ alkyl, yet more preferably from H, $(C_1-C_2)$alkyl, and hydroxy-substituted $(C_1-C_2)$alkyl, and even more preferably from H and hydroxy-substituted $(C_1-C_2)$alkyl. $R^7$ and $R^8$ are preferably independently chosen from H, methyl and ethyl, more preferably H and methyl. Preferably, $R^7$=$R^8$, and more preferably $R^7$=$R^8$=H. It is preferred that $Y^1$ and $Y^2$ are independently chosen from $CO_2H$, $SO_3H$, $PO_3H_2$, and OH, more preferably from $CO_2H$, $SO_3H$, and $PO_3H_2$, and yet more preferably from $CO_2H$ and $SO_3H$. Alternatively, $Y^1$ and $Y^2$ are independently chosen from $CO_2H$, $SO_3H$, and OH. It is preferred that m=1-4, and more preferably 1-3. Preferably, n=1-4, and more preferably n=1-3. It is preferred that x=1-4, more preferably 1-3, and even more preferably 1-2. $Y^1$ and $Y^2$ are preferably the same, that is, preferably $Y^1$=$Y^2$. It is further preferred that $Y^1$ and $Y^2$ are independently chosen from $CO_2H$, $SO_3H$, and OH; each $R^1$, $R^2$, $R^5$ and $R^6$ is independently chosen from H, $(C_1-C_3)$alkyl, and hydroxy-substituted $(C_1-C_3)$alkyl; each $R^3$ and $R^4$ is independently chosen from H and $(C_1-C_3)$alkyl; m=1-4; n=1-4; and x=1-4. Exemplary hydroxy-substituted $(C_1-C_6)$alkyl groups include: 2-hydroxy-1-ethyl; 2-hydroxy-1-propyl; 3-hydroxy-2-butyl, 2-hydroxy-2-propyl, 2-hydroxy-2-methyl-2-propyl, 2-hydroxy-1-butyl, 2-hydroxy-2-methyl-2-butyl, 1-hydroxy-2-butyl, 2-hydroxy-2-methyl-1-proprl, 3-hydroxy-2-butyl, and 2-hydroxymethyl-2-butyl.

Exemplary sulfide compounds include, without limitation: bis-(3-hydroxypropyl)-1,2-dithioethane; 2,2'-((ethane-1,2-diylbis(sulfanediyl))bismethylene)bis(2-(hydroxymethyl) propane-1,3-diol); 3,3'-(methylenebis(sulfanediyl))dipropanol; 2,2'-(methylenebis(sulfanediyl)disuccinic acid; 2,2'-(propane-1,3-diylbis(sulfanediyl))diacetic acid; 2,2'-(propane-1,3-diylbis(sulfanediyl))diethanesulfonic acid; 2,2'-(propane-1,3-diylbis(sulfanediyl))dipropyl sulfonate; 3,3'-(ethane-1,2-diylbis(sulfanediyl))dipropanoic acid; 2,2'-(ethane-1,2-diylbis-(sulfanediyl))diacetic acid; 2,2'-(ethane-1,2-diylbis-(sulfanediyl))diethanesulfonic acid; 3,3'-(ethane-1,2-diylbis(sulfanediyl))bis(propane-1-sulfonic acid); ((ethane-1,2-diylbis(sulfanediyl))bis(propane-3,1-diyl)) diphosphonic acid; ((ethane-1,2-diylbis(sulfanediyl))bis (ethane-2,1-diyl))diphosphonic acid; and ((methylenebis (sulfanediyl))bis(ethane-2,1-diyl))diphosphonic acid. Preferred sulfide compounds are: bis-(3-hydroxypropyl)-1,2-dithioethane; 2,2'-((ethane-1,2-diylbis(sulfanediyl))bismethylene)bis(2-(hydroxymethyl)propane-1,3-diol); 3,3'-(methylenebis(sulfanediyl))dipropanol; 2,2'-(methylenebis (sulfanediyl))disuccinic acid; 2,2'-(propane-1,3-diylbis (sulfanediyl))diacetic acid; 2,2'-(propane-1,3-diylbis (sulfanediyl))diethanesulfonic acid; 2,2'-(propane-1,3-diylbis(sulfanediyl))dipropyl sulfonate; 3,3'-(ethane-1,2-diylbis(sulfanediyl))dipropanoic acid; 2,2'-(ethane-1,2- diylbis-(sulfanediyl))diacetic acid; 2,2'-(ethane-1,2-diylbis-(sulfanediyl))diethanesulfonic acid; and 3,3'-(ethane-1,2-diylbis(sulfanediyl))bis(propane-1-sulfonic acid). More preferred sulfide compounds are 2,2'-((ethane-1,2-diylbis (sulfanediyl))bismethylene)bis(2-(hydroxymethyl)propane-1,3-diol); 2,2'-(methylenebis(sulfanediyl))disuccinic acid; 2,2'-(propane-1,3-diylbis(sulfanediyl))diacetic acid; 2,2'-(propane-1,3-diylbis(sulfanediyl))diethanesulfonic acid; 2,2'-(propane-1,3-diylbis(sulfanediyl))dipropyl sulfonate; 3,3'-(ethane-1,2-diylbis(sulfanediyl))dipropanoic acid; 2,2'-(ethane-1,2-diylbis-(sulfanediyl))diacetic acid; 2,2'-(ethane-1,2-diylbis-(sulfanediyl))diethanesulfonic acid; and 3,3'-(ethane-1,2-diylbis(sulfanediyl))bis(propane-1-sulfonic acid).

In general, the one or more sulfide compounds are used in the present electroplating baths in an amount of from 1 to 10 equivalents, based on the moles of silver ion in the electroplating bath. Preferably, the sulfide compound is present in an amount of from 1 to 8 equivalents, more preferably from 1.5 to 8 equivalents, and yet more preferably from 2 to 6 equivalents. Typically, the sulfide compounds may be used in the present electroplating baths in a variety of concentrations. For example, in a tin-silver alloy electroplating bath, the sulfide compounds are typically used in a concentration of from 0.01 to 25 g/L, preferably from 0.5 to 25 g/L, more preferably from 0.5 to 20 g/L, yet more preferably from 0.5 to 15 g/L; and still more preferably from 0.5 to 10 g/L.

The sulfide compounds are generally commercially available or may be prepared by methods well-known in the literature. Such compounds may be used without further purification or may be further purified prior to use. The present sulfide compounds are bath-soluble. Preferred sulfide compounds have a solubility of ≥5 mg/L in a 17% methane sulfonic acid/DI water solution, preferably >5 mg/L, more preferably ≥10 mg/L, still more preferably ≥20 mg/L, yet more preferably ≥30 mg/L. There is no requirement for the maximum solubility of the sulfide compounds in the present electroplating baths, as such maximum solubility is not critical. Typically, the sulfide compounds have a solubility of ≥5 to 250 mg/L or greater in a 17% methane sulfonic acid/DI water solution.

The present electroplating baths may optionally include one or more alloying metals. Any metal which forms an alloy with silver that can be electrodeposited may suitably be used. Preferred alloying metals include gallium, tin, copper, and mixtures thereof, and more preferably tin, copper and a mixture thereof. Such alloying metals are added to the electroplating bath in a bath-soluble form, such as the corresponding oxide, halide, nitrate, sulfate, carboxylate, alkylsulfonate or arylsulfonate salt, and preferably as the carboxylate, alkylsulfonate or arylsulfonate salt. The amount of such alloying metal used depends upon the alloy to be deposited. The selection of such alloying metal and its amount is well within the knowledge of those skilled in the art.

Preferably, the present electroplating baths contain tin ion as an alloying metal. Any bath-soluble divalent tin salt may suitably be used in the present invention. Examples of such tin compounds include, but are not limited to, tin oxide and salts such as tin halides, tin sulfates, tin alkane sulfonate such as tin methane sulfonate, tin aryl sulfonate such as tin phenyl sulfonate, tin phenol sulfonate, and tin toluene sulfonate, tin alkanol sulfonate, and the like. When tin halide is used, it is preferred that the halide is chloride. It is preferred that the tin compound is tin oxide, tin sulfate, tin chloride, tin alkane sulfonate or tin aryl sulfonate. More preferably, the tin salt is the stannous salt of methanesulfonic acid, ethanesulfonic acid, propanesulfonic acid, 2-hydroxyethane-1-sulfonic acid, 2-hydroxypropane-1-sulfonic acid, or 1-hydroxypropane-2-sulfonic acid, and even more preferably tin methanesulfonate. Mixtures of tin salts may be used. The tin compounds useful in the present invention are generally commercially available from a variety of sources and may be used without further purification. Alternatively, the tin compounds useful in the present invention may be prepared by methods known in the literature.

The amount of bath-soluble tin ion source used in the present electroplating baths may vary over a wide range. Suitable amounts of bath-soluble tin ion source are from 5 to 100 g/L, preferably from 5 to 85 g/L and more preferably from 10 to 85 g/L. Suitable amounts of tin ion source may vary by application. For example, from 5 to 25 g/L of tin ion source may be used for low speed processes and from 30 to 85 g/L for high-speed processes.

In addition to the components described above, the present electroplating baths may optionally include one or more "adjuvants." Adjuvants, as used herein, are additives or compounds that may be added to the composition in addition to the primary ingredients (silver compounds, acidic electrolyte, water, optional alloying metal), which contribute to the effectiveness of the primary ingredients. Examples of suitable adjuvants include, but are not limited to, brighteners, antioxidants, surfactants, grain refiners, conductivity acids and their salts, and mixtures thereof. The list of adjuvants is not exhaustive and any compound or element that improves the effectiveness of silver deposition may be employed to practice the present invention. Such adjuvants may be employed in conventional amounts.

When lustrous surfaces are desired, brighteners may be employed. Suitable brighteners include, but are not limited to, aldehydes, ketones, carboxylic acids, carboxylic acid derivatives, amines or mixtures thereof. Specific examples of suitable brighteners may be found in U.S. Pat. Nos. 4,582,576 and 4,246,077. Such brighteners may be employed in amounts of 50 mg/L to 5 g/L of plating bath, typically from 100 mg/L to 250 mg/L. Compounds of iron, cobalt, nickel, zinc, gallium, arsenic, selenium, palladium, cadmium, indium, antimony, tellurium, thallium, lead and bismuth also are suitable. Polyethylene glycols and their derivatives, such as polyethyleneglycol ethers, to the extent that they are bath-soluble also are suitable brighteners. Polyethylene glycols and their derivatives may be employed as the only brighteners or they may be employed with the other brighteners disclosed above.

Antioxidants may be added to the present composition when tin ions are present to assist in keeping the tin in a soluble, divalent state. Suitable antioxidants include, but are not limited to, hydroquinone and hydroxylated aromatic compounds, such as resorcinol, catechol, and the like, including sulfonic acids derivatives of such aromatic compounds. Such antioxidants are disclosed in U.S. Pat. No. 4,871,429. Other suitable antioxidants or reducing agents include, but are not limited to, vanadium compounds, such as vanadylacetylacetonate, vanadium triacetylacetonate, vanadium halides, vanadium oxyhalides, vanadium alkoxides and vanadyl alkoxides. The amount of such reducing agent is well known to those skilled in the art, but is typically in the range of from 0.1 g/L to 5 g/L.

One or more surfactants may optionally be used in the present electroplating baths. Such surfactants include, but are not limited to, nonionic surfactants, anionic surfactants, amphoteric surfactants and cationic surfactants. Preferably, the optional surfactant is chosen from one or more of nonionic surfactants, anionic surfactants, and amphoteric surfactants. Suitable nonionic surfactants include those in which 2-300 moles of ethylene oxide (EO) and/or propylene oxide (PO) are condensed with any of the following: $(C_1-C_{20})$alkanols, phenols, naphthols, bisphenols, $(C_1-C_{25})$alkylphenols, aryl alkylphenols, $(C_1-C_{25})$alkylnaphthols, $(C_1-C_{25})$alkoxylated phosphoric acids (salt), sorbitan esters, styrenated phenols, polyalkyleneglycols, $(C_1-C_{22})$aliphatic amines, $(C_1-C_{22})$aliphatic amides; or $(C_1-C_{25})$alkoxylated phosphoric acids (salts), and the like. Such surfactants are generally commercially available from a variety of sources.

Another preferred surfactant useful in the present electroplating baths is an alkoxylated amine oxide surfactant. While a variety of amine-oxide surfactants are known, it is preferred that low-foaming alkoxylated amine oxide surfactants are used. Preferred alkoxylated amine oxide surfactants have viscosities of less than 5000 centipoise (cps) measured using a Brookfield LVT Viscometer with a #2 spindle. Typically, this viscosity is determined at ambient temperature (approximately 20° C.). Preferred alkoxylated amine oxides have the formula:

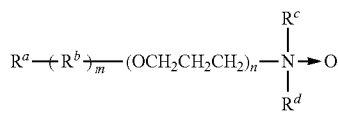

wherein $R^a$ is selected from a $(C_6-C_{22})$alkyl group and a substituted $(C_7-C_{22})$aryl group; $R^b$ is an alkoxylated unit; m is 0 to 7 and represents the number of moles of $R^b$; n is 0 or 1; and $R^c$ and $R^d$ are each at least one alkoxylated unit and the total number of alkoxylated units present in $R^c$ and $R^d$ is from 3 to 30. Alkoxylated units refer to the individual alkylene oxide units added to the amine. Suitable alkylene oxide units include ethyleneoxy, propyleneoxy, butyleneoxy, and mixtures thereof, including isomers. $R^a$ is preferably selected from a $(C_6-C_{22})$alkyl group. $R^b$ may be selected from various alkylene oxide units, such as styrene oxide, ethyleneoxy, propyleneoxy, butyleneoxy and mixtures thereof. It is preferred that the alkoxylated units for $R^b$ are selected from ethyleneoxy, propyleneoxy, butyleneoxy and mixtures thereof. Preferred alkoxylated units for $R^c$ and $R^d$ include ethyleneoxy, propyleneoxy, and butyleneoxy units including mixtures thereof. It is preferred that $R^c$ and $R^d$ are each selected from ethyleneoxy units propyleneoxy units, and mixtures thereof. More preferably, $R^c$ and $R^d$ are each ethyleneoxy units. Preferred amine oxide surfactants include from 5 to 20 moles of alkoxylated units present in $R^c$ and $R^d$. More preferably, $R^c$ and $R^d$ include from 5 to 15 moles of alkoxylated units. Particularly suitable amine oxide surfactants are those wherein each of $R^c$ and $R^d$ are composed of 3.5 to 10 moles of alkoxylated units selected from ethyleneoxy units, propyleneoxy units, and mixtures thereof. Preferably, m=0. It is preferred that n=1. More preferred are amine oxides where m=0 and n=1, and more preferably $R^a$ is $(C_6-C_{22})$alkyl group. Yet more preferred amine oxides are those where m=0, n=1, $R^a$ is a $(C_6-C_{22})$alkyl group, and $R^c$ and $R^d$ are each ethyleneoxy units.

Alkoxylated amine oxide surfactants are generally commercially available or may be prepared following known procedures, such as those described in U.S. Pat. No. 5,972,875. Preferred amine oxide surfactants are those sold under the Tomamine brand, available from Air Products, such as those having the designation AO-14-2, AO-728, AO-405 and AO-455. The amine oxide surfactants are used in the present electroplating baths in an amount of from 0.1 to 50 g/L, preferably from 0.1 to 25 g/L, more preferably from 0.5 to 25 g/L, yet more preferably from 1 to 20 g/L, and still more preferably from 5 to 20 g/L.

Grain refiners are optionally used in the present silver electroplating baths. When a tin-silver alloy electroplating bath is used, it is preferred that one or more grain refiners are used. Any suitable grain refiners may be used in the present invention. Such compounds provide good grain structure to the deposits and at the same time provide a uniform mushroom morphology to the interconnect bumps (solder bumps) deposited from the compositions. Preferably, the grain refiner is a flavone compound. Such flavone compounds include, but are not limited to, chrysin, fisetin, myricetin, rutin, and pentahydroxy flavones such as morin and quercitrin. Suitable flavones compounds are those disclosed in U.S. Pat. No. 7,968,444. The flavone compounds may be present in an amount of from 1 to 200 mg/L, preferably from 10 to 100 mg/L, and more preferably from 25 to 85 mg/L.

Optionally, one or more grain refiner/stabilizer compounds may be included in the compositions to further improve the electroplating operating window. It is preferred that one or more grain refiner/stabilizer compounds be present in the compositions of the invention. Such grain refiner/stabilizer compounds include, but are not limited to: hydroxylated gamma-pyrones such as maltol, ethylmaltol, kojic acid, meconic acid, and comenic acid; hydroxylated benzoquinones such as chloranilic acid and dihydroxybenzoquinone; hydroxylated naphthols such as chromotropic acid; anthraquinone; hydroxylated pyridines; cyclopentandiones; hydroxy-furanones; hydroxy-pyrrolidones; and cyclohexanediones. Such compounds may be included in the compositions in amounts of 2 to 10,000 mg/L, and preferably from 50 to 2000 mg/L.

Conductivity acids and their salts also may be employed in the present compositions and include, but are not limited to, boric acid, carboxylic acids, hydroxy acids, and salts of these acids to the extent they are bath-soluble. Preferred are formic acid, acetic acid, oxalic acid, citric acid, malic acid, tartaric acid, gluconic acid, glucaric acid, glucuronic acid, and salts of these acids. Such conductivity acids and salts are employed in conventional amounts.

Electroplating baths of the present invention are prepared by combining the following: a bath-soluble source of silver ions; acid electrolyte; a sulfide compound described above, and any of the following optional components: a bath-soluble source of one or more alloying metals, brighteners, antioxidants, surfactants, grain refiners, conductivity acids and their salts, and mixtures thereof, with the balance of the composition being water. Such components may be combined in any order. The water used is preferably DI water. The amount of each of the above components can be adjusted and selected as appropriate depending on the particular application. Once the composition is prepared, undesired material can be removed, such as by filtration, and then additional water is typically added to adjust the final volume of the composition. The composition may be agitated by any known means, such as stirring, pumping, or recirculating, for increased plating speed. The present silver or silver-alloy electroplating compositions are acidic, that is, they have a pH of less than 7. Typically, the present electroplating compositions have a pH of from 0 to less than 7, preferably from 0 to ≤5, more preferably from 0 to ≤2, and yet more preferably from 0 to ≤1.

Preferably, the present electroplating baths are substantially free of cyanide ions. The term "substantially free" means that the compositions contain less than 1 wt % of that component, and preferably less than 0.5 wt % of that component.

The present electroplating compositions are suitable for depositing a silver-containing layer on a substrate. The term "silver-containing layer" refers to both a silver layer and a silver alloy layer. In such silver alloy layer, the silver and the one or more allying metals may be present in various amounts. Such silver alloy layers include, without limitation, tin-silver, tin-silver-copper, tin-silver-copper-antimony, tin-silver-copper-manganese, tin-silver-bismuth, tin-silver-indium, tin-silver-zinc-copper, and tin-silver-indium-bismuth. Preferably, the present electroplating compositions deposit an alloy of tin-silver or tin-silver-copper, and more preferably tin-silver. Tin-silver alloys deposited from the present electroplating bath contain an amount of tin ranging from 0.01 to 99.99 wt %, and an amount of silver ranging from 99.99 to 0.01 wt %, based on the weight of the alloy, as measured by either atomic adsorption spectroscopy (AAS), X-ray fluorescence (XRF), inductively coupled plasma (ICP) or differential scanning calorimetry (DSC). Preferably, the tin-silver alloys deposited using the present invention contain from 75 to 99.99 wt % tin and 0.01 to 10 wt % of silver and any other alloying metal. More preferably, the tin-silver alloy deposits contain from 95 to 99.9 wt % tin and 0.1 to 5 wt % of silver and any other alloying metal. Tin-silver alloy is the preferred deposit, and preferably contains from 90 to 99.9 wt % tin and from 10 to 0.1 wt % silver. More preferably, the tin-silver alloy deposits contain from 95 to 99.9 wt % tin and from 5 to 0.1 wt % silver. For many applications, the eutectic composition of a silver alloy may be used. Silver alloys deposited according to the present invention are substantially free of lead, that is, they contain ≤1 wt % lead, more preferably ≤0.5 wt %, and yet more preferably ≤0.2 wt %, and still more preferably are free of lead.

The electrolyte compositions of the present invention are useful in various plating methods where a silver or silver alloy layer is desired. Plating methods include, but are not limited to, horizontal or vertical wafer plating, barrel plating, rack plating, high speed plating such as reel-to-reel and jet plating, and rackless plating. A silver or silver alloy layer may be deposited on a substrate by the steps of contacting the substrate with the above electrolyte composition and passing a current through the electrolyte to deposit the silver-containing layer on the substrate. Substrates which may be plated include, but are not limited to, copper, copper alloys, nickel, nickel alloys, nickel-iron containing materials, electronic components, plastics, and semiconductor wafers such as silicon or gallium-arsenide wafers. Plastics which may be plated include, without limitation, plastic laminates, such as printing wiring boards, particularly copper clad printed wiring boards. The electrolyte compositions may be used for electroplating of electronic components, such as lead frames, semiconductor wafers, semiconductor packages, components, connectors, contacts, chip capacitors, chip resistors, printed wiring boards, and wafer interconnect bump plating applications. The substrate may be contacted with the electrolyte composition in any manner known in the art. Typically, the substrate is placed in a tank containing the electrolyte composition.

The particular current density used to deposit the silver or silver alloy depends on the particular plating method. Generally, the current density is ≥1 $A/dm^2$, such as from 1 to 200 $A/dm^2$, preferably from 2 to 30 $A/dm^2$, more preferably from 2 to 20 $A/dm^2$, even more preferably from 5 to 20 $A/dm^2$, and yet more preferably from 8 to 20 $A/dm^2$.

Silver or silver alloys may be deposited at a temperature of 15° C. or higher, preferably in the range of from 15° to 66° C., and more preferably from 20° to 55° C. In general, the longer the time the substrate is plated the thicker the deposit while the shorter the time the thinner the deposit for a given temperature and current density. Thus, the length of time a substrate remains in a plating composition may be used to control the thickness of the resulting silver-containing deposit. In general, metal deposition rates may be as high as 15 μm/min, or higher. Typically, deposition rates may range from 1 to 10 μm/min, and preferably from 3 to 8 μm/min.

While the present electrolyte compositions may be used for a variety of applications as described above, an exemplary application is for interconnect bump (solder bump) formation for wafer-level-packaging. This method involves providing a semiconductor die (wafer die) having a plurality of interconnect bump pads, forming a seed layer over the interconnect bump pads, depositing a silver-containing interconnect bump layer, preferably a silver-alloy layer such as tin-silver alloy, over the interconnect bump pads by contacting the semiconductor die with the present electroplating composition and passing a current through the electroplating composition to deposit the silver-containing layer interconnect bump layer on the substrate, and then reflowing the interconnect bump layer to form a solder bump.

In general, a device includes a semiconductor substrate on which is formed a plurality of conductive interconnect bump pads. The semiconductor substrate may be a single-crystal silicon wafer, a silicon-germanium substrate, a gallium-arsenide substrate, a silicon-on-sapphire (SOS) substrate, or a silicon-on-insulator (SOI) substrate. The conductive interconnect bump pad may be one or more layers of a metal, composite metal or metal alloy typically formed by physical vapor deposition (PVD) such as sputtering. Typical conductive interconnect bump pad materials include, without limitation, aluminum, copper, titanium nitride, and alloys thereof.

A passivation layer is formed over the interconnect bump pads and openings extending to the interconnect bump pads are formed therein by an etching process, typically by dry etching. The passivation layer is typically an insulating material, for example, silicon nitride, silicon oxynitride, or a silicon oxide, such as phosphosilicate glass (PSG). Such materials may be deposited by chemical vapor deposition (CVD) processes, such as plasma enhanced CVD (PECVD).

An under bump metallization (UBM) structure formed typically of a plurality of metal or metal alloy layers, is deposited over the device. The UBM acts as an adhesive layer and electrical contact base (seed layer) for an interconnect bump to be formed. The layers forming the UBM structure may be deposited by PVD, such as sputtering or evaporation, or CVD processes. Without limitations, the UBM structure may be, for example, a composite structure including in order, a bottom chrome layer, a copper layer, and an upper tin layer.

A photoresist layer is applied to the device, followed by standard photolithographic exposure and development techniques to form a patterned photoresist layer (or plating mask) having openings or vias therein (plating vias). The dimensions of the plating mask (thickness of the plating mask and the size of the openings in the pattern) defines the size and location of the silver-containing layer deposited over the I/O pad and UBM. The diameters of such deposits typically range from 5 to 300 μm, preferably from 10 to 150 μm. The height of such deposits typically range from 10 to 150 μm, preferably from 15 to 150 μm, and more preferably from 20 to 80 μm. Suitable photoresist materials are commercially available (such as from Dow Electronic Materials, Marlborough, Mass., USA) and are well-known in the art.

The interconnect bump material is deposited on the device by an electroplating process using the above-described electroplating compositions. Interconnect bump materials include, for example, silver and any suitable silver alloys such as tin-silver, tin-silver-copper, and the like. Such alloys may have compositions such as described above. It may be desired to use such compositions at their eutectic concentrations. The bump material is electrodeposited in the areas defined by the plating via. For this purpose, a horizontal or vertical wafer plating system, for example, a fountain plating system, is typically used with a direct current (DC) or pulse-plating technique. In the plating process the interconnect bump material completely fills the via extending above and on a portion of the top surface of the plating mask, resulting in a mushroom-shaped metal deposit. This ensures that a sufficient volume of interconnect bump material is deposited to achieve the desired ball size after reflow. In the via plating process, the photoresist thickness is sufficiently thick such that the appropriate volume of interconnect bump material is contained within the plating mask via. A layer of copper or nickel may be electrodeposited in the plating via prior to plating the interconnect bump material. Such a layer may act as a wettable foundation to the interconnect bump upon reflow.

Following deposition of the interconnect bump material, the plating mask is stripped using an appropriate solvent or other remover. Such removers are well known in the art. The UBM structure is then selectively etched using known techniques, removing all metal from the field area around and between interconnect bumps.

The wafer is then optionally fluxed and is heated in a reflow oven to a temperature at which the interconnect bump material melts and flows into a truncated substantially spherical shape. Heating techniques are known in the art, and include, for example, infrared, conduction, and convection techniques, and combinations thereof. The reflowed interconnect bump is generally coextensive with the edges of the UBM structure. The heat treatment step may be conducted in an inert gas atmosphere or in air, with the particular process temperature and time being dependent upon the particular composition of the interconnect bump material.

Alternatively, the present electroplating compositions may be used to deposit a silver or silver alloy capping layer on a solder deposit. Preferably, a silver alloy is used for the capping layer. For example, a tin-silver alloy may be deposited on top of a copper pillar, such as that used in the manufacture of flip-chip interconnects. When used as a capping layer on a copper pillar, the total height of such capped copper pillar may range from 20 to 50 µm, and may have a diameter of from 30 to 45 µm, although other dimensions are suitable. In a further alternative, such capping layer solder deposits may contain a plurality of capping layers. Other suitable capping layers that may be used with the present silver-containing layer include: pure tin and tin-alloys such as tin-bismuth and tin-copper. Where a plurality of capping layers are used, the silver-containing layer is typically the topmost layer.

EXAMPLE 1

3,3'-(Ethane-1,2-diylbis(sulfanediyl))dipropanamide (Compound 1)

Sodium tetraborate (1.20 g, 5.95 mmol) was dissolved in DI water (150 mL). 1,2-Ethane dithiol (5.00 mL, 59.4 mmol) was added, followed by acrylamide (9.31 g, 130 mmol), and stirred at room temperature for two hours to give a white-colored slurry. The solid was filtered off, washed with water and dried under vacuum, giving 13.1 g (93.2%) of Compound 1 as a white solid. $^1$H NMR (500 MHz, d6-DMSO) δ 7.33 (s, 2H), 6.82 (s, 2H), 3.37 (s, 4H), 2.69 (t, J=7.2 Hz 4H), 2.32 (t, J=7.3 Hz, 4H). $^{13}$C NMR (126 MHz, d6-DMSO) δ 172.68, 35.69, 31.35, 26.92.

EXAMPLE 2

3,3'-(Ethane-1,2-diylbis(sulfanediyl))dipropanoic acid (Compound 2)

The procedure of Example 1 was generally repeated except that acrylamide was replaced with methyl acrylate to form the diester compound dimethyl 3,3'-(ethane-1,2-diylbis(sulfanediyl))dipropanoate. This diester (5.00 g, 18.8 mmol) was heated to reflux in 2 N HCl (50 mL) for two hours, and then cooled to room temperature overnight, giving a white precipitate. The solid was filtered off, washed with water and dried under vacuum, giving 4.26 g (95.2%) of Compound 2 as a white sold. $^1$H NMR (500 MHz, d6-DMSO) δ 12.10 (s, 2H), 2.61 (t, J=7.1 Hz, 4H), 2.60 (s, 4H), 2.40 (t, J=7.1 Hz, 4H). 13C NMR (126 MHz, d6-DMSO) δ 172.98, 31.70, 31.47, 26.44.

EXAMPLE 3

2,2'-(Ethane-1,2-diylbis(sulfanediyl))diacetic acid (Compound 3)

1,2-ethane dithiol (5.00 mL, 59.4 mmol) was dissolved in $CH_2Cl_2$ (100 mL) and $Et_3N$ (15.0 g, 149 mmol) was added. The mixture was then cooled to 0° C. and a solution of bromomethylacetate (19.1 g, 125 mmol) in $CH_2Cl_2$ (25 mL) was slowly added dropwise. After the addition was complete, the reaction mixture was allowed to warm to ambient temperature and stirred for two hours. The organic phase was washed with 0.5 M HCl (100 mL), saturated aqueous $NaHCO_3$, brine and dried over $Na_2SO_4$, then concentrated, giving 12.9 g (90.8%) of the diester compound, dimethyl 2,2'-(ethane-1,2-diylbis(sulfanediyl))diacetate, as a clear oil. $^1$H NMR (500 MHz, $CDCl_3$) δ 3.74 (s, 6H), 3.28 (s, 4H), 2.89 (s, 4H). $^{13}$C NMR (126 MHz, $CDCl_3$) δ 170.53, 52.31, 33.15, 31.87.

Dimethyl 2,2'-(ethane-1,2-diylbis(sulfanediyl))diacetate (7.00 g, 29.4 mmol) was heated to reflux for two hours in 2 N HCl (50 mL). Cooling the mixture to room temperature gave a clear solution, which was concentrated to dryness in vacuo, giving Compound 3 as a white solid, 5.98 g (96.8%). $^1$H NMR (400 MHz, $D_2O$) δ 3.47 (s, 4H), 2.95 (s, 4H). $^{13}$C NMR (101 MHz, $D_2O$) δ 174.61, 33.28, 31.39.

EXAMPLE 4

2,2'-(Ethane-1,2-diylbis(sulfanediyl))diethanesulfonic acid (Compound 4)

To a solution of 2-bromoethylsulfonate sodium salt (25.6 g, 125 mmol) and sodium methoxide (8.03 g, 149 mmol) in EtOH (350 mL) at 0° C. was added, dropwise, a solution of 1,2-ethanedithiol (5.00 mL, 59.4 mmol) in EtOH (25 mL). The reaction mixture was allowed to warm to room temperature, and then heated to reflux for 48 hours. Next, the mixture was cooled to room temperature, and then acidified with 2 N HCl to pH 1-2. The resulting suspension was heated to 75° C. and water was slowly added in small portions until a clear solution was obtained. The reaction mixture was then cooled to room temperature, and then to 5° C. The resulting white precipitate was filtered off, washed with cold EtOH and dried, giving 11.9 g (64.6%) of Compound 4 as a white powder. $^1$H NMR (500 MHz, $D_2O$) δ 3.27 (t, J=9.3, 6.4 Hz, 4H), 3.06-2.99 (m, 4H), 2.98 (s, 4H). $^{13}$C NMR (126 MHz, $D_2O$) δ 51.11, 31.09, 25.58.

EXAMPLE 5

3,3'-(ethane-1,2-diylbis(sulfanediyl))bis(propane-1-sulfonic acid) (Compound 5)

To a solution of 3-bromopropane sulfonic acid sodium salt (24.7 g, 110 mmol) and sodium methoxide (7.06 g, 131 mmol) in EtOH (300 mL) at ambient temperature was added, dropwise, 1,2-ethanedithiol (4.4 mL, 52.3 mmol) in ethanol (25 mL). Allowed to stir at room temperature for one hour, and then heated to reflux overnight. Cooled to room temperature and acidified with 2 N HCl to pH 1-2. The resulting suspension was heated to 75° C. and water was slowly added in small portions until a clear solution was obtained. Cooled to room temperature, and then to 5° C. The resulting white precipitate was filtered off, washed with cold EtOH and dried, giving 11.9 g (67.4%) as a white powder. $^1$H NMR (400 MHz, $D_2O$) δ 3.10 (t, J=7.2 Hz, 4H), 2.92 (s, 4H), 2.82 (t, J=7.2 Hz, 4H), 2.11 (m, 4H). $^{13}$C NMR (101 MHz, $D_2O$) δ 52.26, 33.38, 32.27, 26.80.

EXAMPLE 6

3,3'-[1,2-Ethanediylbis(thio)]bis-1-propanol (Compound 6)

A solution of 3-chloropropanol (56.5 g, 0.569 mol) in acetonitrile (50 mL) was slowly added dropwise to a solution of 1,2-dithioethane (25.0 g, 0.265 mol) and sodium carbonate (70.3 g, 0.663 mol) in acetonitrile (100 mL). After the addition was completed, the reaction mixture was heated to reflux for three hours, and then cooled to ambient temperature. DI water (100 mL) was added to dissolve the solids, and the resulting solution was extracted with EtOAc (200 mL). The organic phase was washed with water (100 mL) and brine (50 mL), followed by drying over $Na_2SO_4$. Concentration to dryness, followed by re-crystallization from EtOAc gave 18.2 g of Compound 6 (33%) as a white solid. $^1$H NMR ($CDCl_3$) δ 3.76 (t, J=6.0 Hz, 4H), 2.76 (s, 1H), 2.68 (t, J=7.1 Hz, 4H), 1.97 bs, 2H), 1.86 (dd, J=9.6, 3.6 Hz, 4H). $^{13}$C NMR ($CDCl_3$) δ 61.50, 32.01, 32.05, 28.79.

EXAMPLE 7

3,3'-(Methylenebis(sulfanediyl))dipropanol (Compound 7)

3-Mercaptopropanol (5.20 mL, 60.5 mmol) and crushed sodium hydroxide (2.42 g, 60.5 mmol) were added to a round-bottom flask equipped with a condenser and an addition funnel. The flask was placed in an ice bath and the flask contents were allowed to stir. While keeping the reaction mixture below 20° C., dibromomethane (2.08 mL, 30.2 mmol) was added dropwise via an addition funnel. Upon completion of the addition, the reaction mixture was allowed to warm to room temperature and then was heated at reflux overnight. During this time, the color turned yellow. To the solid residue was added some dichloromethane which did not dissolve the crude product. DI water was added and all of the contents went into solution. The reaction mixture was concentrated under reduced pressure to remove the water and any dibromomethane. The crude product was dissolved in DI water again and filtered through a syringe filter and concentrated. The product was left under high vacuum at 80° C. to remove any starting 3-mercaptopropanol. This was not removed, so an additional 2 pellets of NaOH were crushed and stirred into the crude product. About 300 µL of dibromomethane was stirred in. The reaction vial was hand stirred and placed in an oil bath at 80° C. overnight to melt everything together. The reaction mixture was concentrated down and the dibromomethane was removed. The product was placed under high vacuum to afford 6.21 grams of Compound 7 as a pale yellow solid. $^1$H NMR (500 MHz, $D_2O$) δ 4.14 (d, J=19.4 Hz, 2H), 4.01 (t, J=6.4 Hz, 4H), 3.07 (t, J=7.3 Hz, 4H), 2.24-2.12 (m, 4H). $^{13}$C NMR (126 MHz, $D_2O$) δ 60.92, 34.75, 31.42, 27.79.

EXAMPLE 8

2,2'-(Methylenebis(sulfanediyl))diacetic acid (Compound 8)

To a round-bottom flask was added formaldehyde (10.0 mL, 124 mmol) and thioglycolic acid (18.9 g, 206 mmol). This mixture was allowed to stir and concentrated hydrochloric acid (7 mL) was added dropwise. The reaction mixture was stirred at 50° C. for one hour and then at 110° C. overnight. The reaction mixture was cooled to room temperature and then stored in a refrigerator for three days. During this time, a white solid had formed. The solid was isolated by filtration, then recrystallized from water to give 8.16 g (26.22 mmol, 32.0%) of 9 as a white solid. $^1$H NMR (500 MHz, d6-DMSO) δ 3.39 (s, 4H), 3.94 (s, 2H). $^{13}$C NMR (126 MHz, d6-DMSO) δ 32.65, 37.01, 173.76.

EXAMPLE 9

2,2'-(Methylenebis(sulfanediyl))disuccinic acid (Compound 9)

To a round-bottom flask was added formaldehyde (7.95 mL, 98.3 mmol) and mercaptosuccinic acid (24.6 g, 163.8 mmol). This mixture was allowed to stir and concentrated hydrochloric acid (7 mL) was added dropwise. The reaction mixture was stirred at 50° C. for one hour and then at 110° C. overnight. The reaction mixture was cooled to room temperature, then stored in a refrigerator for three days. During this time, a white solid had formed. The solid was isolated by filtration, then recrystallized from water to give 8.16 g (26.22 mmol, 32.0%) of 9 as a white solid. $^1$H NMR (500 MHz, d6-DMSO) δ 4.01-3.97 (m, 2H), 3.71 (ddd, J=12.4, 6.2, 3.5 Hz, 2H), 2.81-2.71 (m, 2H), 2.64-2.55 (m, 2H). $^{13}$C NMR (126 MHz, d6-DMSO) δ 172.73, 172.04, 40.77, 36.12, 34.84.

EXAMPLE 10

2,2'-(Propane-1,3-diylbis(sulfanediyl))diacetic acid (Compound 10)

1,3-propanedithiol (5.00 mL, 49.9 mmol) was dissolved in $CH_2Cl_2$ (100 mL) and triethylamine (17.4 mL, 125 mmol) was added. The reaction mixture was cooled to 0° C. and a solution of methyl bromoacetate (9.85 mL, 105 mmol) in methylene chloride (50 mL) was added dropwise. After the addition was completed, the reaction mixture was allowed to warm to room temperature and stirred for two hours. The organic phase was washed with 0.5 M HCl (100 mL), saturated aqueous $NaHCO_3$, brine and dried over $Na_2SO_4$. The organic phase was filtered using fluted filter paper and concentrated under reduced pressure giving a pale yellow oil yielding 11.3 g (44.9 mmol, 90.0%) of dimethyl 2,2'-(propane-1,3-diylbis(sulfanediyl))diacetate. $^1$H NMR (400 MHz, $CD_2Cl_2$) δ 3.65 (s, 6H), 3.18 (s, 4H), 2.67 (t, J=7.2 Hz, 4H), 1.83 (p, J=7.1 Hz, 2H). $^{13}$C NMR (101 MHz, $CD_2Cl_2$) δ 171.09, 52.58, 33.73, 31.68, 28.62.

Dimethyl 2,2'-(propane-1,3-diylbis(sulfanediyl))diacetate (11.3 g, 44.9 mmol) was heated to reflux for two hours in 2 N HCl (50 mL). Upon completion, the reaction mixture was cooled to room temperature. The reaction mixture was concentrated to dryness under reduced pressure to give 7.29 g of Compound 10 as an off-white solid (32.5 mmol, 72.4%). $^1$H NMR (400 MHz, $CD_2Cl_2$) δ 11.45 (s, 2H), 3.28 (s, 4H), 2.82-2.69 (m, 4H), 1.92 (p, J=7.2 Hz, 2H). $^{13}$C NMR (101 MHz, $CD_2Cl_2$) δ 177.36, 33.93, 31.90, 28.63.

EXAMPLE 11

2,2'-(Propane-1,3-diylbis(sulfanediyl))diethyl sulfonate (Compound 11)

To a solution of 2-bromoethylsulfonate sodium salt (21.0 g, 100 mmol) and sodium methoxide (5.40 g, 100 mmol) in ethanol (350 mL) at 0° C. was added a solution of 1,3-propanedithiol (5.00 mL, 50.0 mmol) in EtOH (25.0 mL) dropwise. This reaction mixture was allowed to warm to ambient temperature, and then heated to reflux for 48 hours. The reaction mixture was cooled to room temperature, and then acidified to pH 1-2 using 2 N HCl. The resulting suspension was heated to 75° C. and water was slowly added in small portions until a clear pale yellow solution was obtained. This solution was allowed to equilibrate to room temperature and then cooled to 5° C. The resulting white precipitate was filtered off, washed with cold EtOH, and dried. Recrystallization from ethanol gave Compound 11 as a white solid (3.99 g, 24.8%). $^1$H NMR (400 MHz, $D_2O$) δ 3.34-3.13 (m, 4H), 3.07-2.91 (m, 4H), 2.85-2.71 (m, 4H), 2.07-1.90 (m, 2H). $^{13}$C NMR (126 MHz, $D_2O$) δ 51.08, 29.95, 28.16, 25.50.

EXAMPLE 12

3,3'-(Propane-1,3-diylbis(sulfanediyl))dipropyl sulfonate (Compound 12)

To a solution of 3-bromopropylsulfonate sodium salt (22.4 g, 100 mmol) and sodium methoxide (5.40 g, 100 mmol) in ethanol (350 mL) at room temperature was added a solution of 1,3-propanedithiol (5 mL, 50.0 mmol) in EtOH (25 mL) dropwise. This reaction mixture was heated to reflux overnight. The reaction mixture was cooled to room temperature, and then acidified to a pH of 1-2 using 2 N HCl. The resulting suspension was heated to 75° C. and water was slowly added in small portions until a clear pale yellow solution was obtained. This solution was allowed to equilibrate to room temperature and then cooled to 5° C. The resulting white precipitate was filtered off, washed with cold EtOH and dried. The crude product was recrystallized from ethanol to give 10.4 g of Compound 12 as a white solid (29.69 mmol, 59.4%). $^1$H NMR (500 MHz, $D_2O$) δ 3.17-3.07 (m, 4H), 2.88-2.73 (m, 8H), 2.18-2.09 (m, 4H), 2.06-1.92 (m, 2H). $^{13}$C NMR (126 MHz, $D_2O$) δ 49.88, 29.78, 28.55, 24.26.

COMPARATIVE EXAMPLE 1

2,2'-[1,2-ethanediylbis(thio)]bis-ethanol (Comparative 1)

A solution of 2-chloroethanol (48.1 g, 0.597 mol) in acetonitrile (50 mL) was slowly added dropwise to a solution of 1,2-dithioethane (25.0 g, 0.265 mol) and sodium carbonate (70.3 g, 0.663 mol) in acetonitrile (100 mL). After the addition was completed, the reaction mixture was heated to reflux for 3 hours, and then cooled to ambient temperature. DI water (100 mL) was added to dissolve the solids, and the resulting solution was extracted with EtOAc (200 mL). The organic phase was washed with water (100 mL) and brine (50 mL), followed by drying over $Na_2SO_4$. Concentration to dryness, followed by re-crystallization from EtOAc gave 4.60 g (9.5%) of Comparative 1 as a white solid. $^1$H NMR ($CDCl_3$) δ 3.76 (t, J=5.9 Hz, 4H), 2.78 (s, 4H), 2.77 (t, J=5.9 Hz, 4H). $^{13}$C NMR ($CDCl_3$) δ 60.75, 35.41, 32.08.

COMPARATIVE EXAMPLE 2

2,2'-(Methylenebis(sulfanediyl))diethanol (Comparative 2)

2-Mercaptoethanol (6.00 mL, 85.4 mmol) and crushed sodium hydroxide (3.41 g, 85.4 mmol) were added to a round-bottom flask equipped with a condenser, stir bar, and an addition funnel. The flask was placed in an ice bath and the flask contents were allowed to stir. While keeping the reaction mixture below 20° C., dibromomethane (2.93 mL, 42.7 mmol) was added dropwise via an addition funnel. Upon completion of the addition, the reaction mixture was allowed to equilibrate to room temperature and then was refluxed at 80° C. for approximately 2 hours. After cooling to room temperature, the mixture was concentrated to dryness, then dissolved in a minimum amount of water, filtered, and concentrated to dryness. Extraction of the resulting solid with ethyl acetate, followed by concentration to dryness gave compound Comparative 2 (7.05 g, 98%) as a colorless, low melting solid. $^1$H NMR (500 MHz, $D_2O$) δ 3.99 (s, 2H), 3.94 (t, J=6.3 Hz, 4H), 3.00 (t, J=6.3 Hz, 4H). $^{13}$C NMR (126 MHz, $D_2O$) δ 60.43, 34.65, 33.14.

EXAMPLE 13

The solubility of Compounds 1-12 and Comparatives 1 and 2 was evaluated as follows: 25 mg of each compound was weighed out into a vial and 5 mL of a 17% methane sulfonic acid (MSA)/DI water solution was added. If a compound dissolved, then an additional 25 mg (in increments) of that compound was added until either no more would dissolve or 250 mg were dissolved in the 5 mL. The results are shown in Table 1.

The stability of various compounds was determined as follows: 5 mg of a compound was dissolved into 1 mL of 17% MSA/water solution and placed in a glass vial. Each vial was capped and placed in a dry heating bath at 50° C. for up to three weeks. Each sample was periodically removed from the bath and visually inspected for evidence of precipitation. The results are shown in Table 1.

The stability of Compound 6 and Comparative 1 were determined using 2 different tests. In Test 1, solutions of each of Compound 6 and Comparative 1 dissolved in DI water (at a concentration of 5.96 mg/mL) were placed in separate vials. To each vial was added aqueous MSA (70%), the vials were then capped, placed in a 50° C. oven, and periodically visually inspected for the formation of precipitate. After 60 hours, the solution of Comparative 1 showed a copious amount of a white, flocculent precipitate. In comparison, the solution of Compound 6 showed no precipitate formation by visual inspection after 120 hours. In Test 2, solutions of each of Compound 6 and Comparative 1 dissolved in $D_2O$ (at a concentration of 5.96 mg/mL) were placed in separate NMR tubes. A $^1$H NMR (400 MHz) spectrum was obtained for each solution. Next, a solution of MSA (70%) dissolved in $D_2O$ was prepared and added to each NMR tube. A second $^1$H NMR spectrum was immediately taken of each sample. Next, the NMR tubes were placed in a 50° C. oven, and periodically removed, analyzed by $^1$H NMR, and returned to the oven. Comparative 1 showed loss of the $^1$H NMR spectrum immediately upon addition of the MSA solution, whereas Compound 6 showed no change in the $^1$H NMR spectrum after 7 days.

EXAMPLE 14

The general procedures of Examples 1-10 are repeated to prepare the following sulfide compounds.

TABLE 1

| Compound | Structure | Solubility (mg/mL) | Stability (at 50° C.) |
|---|---|---|---|
| 1 | H$_2$NOC-CH$_2$CH$_2$-S-CH$_2$CH$_2$CH$_2$-S-CH$_2$CH$_2$-CONH$_2$ | <5.0 | |
| 2 | HO$_2$C-CH$_2$CH$_2$-S-CH$_2$CH$_2$CH$_2$-S-CH$_2$CH$_2$-CO$_2$H | <5.0 | |
| 3 | HO$_2$C-CH$_2$-S-CH$_2$CH$_2$CH$_2$-S-CH$_2$-CO$_2$H | 30 | |
| 4 | HO$_3$S-CH$_2$CH$_2$-S-CH$_2$CH$_2$CH$_2$-S-CH$_2$CH$_2$-SO$_3$H | >60 | |
| 5 | HO$_3$S-CH$_2$CH$_2$CH$_2$-S-CH$_2$CH$_2$CH$_2$-S-CH$_2$CH$_2$CH$_2$-SO$_3$H | >60 | |
| 6 | HO-CH$_2$CH$_2$CH$_2$-S-CH$_2$CH$_2$CH$_2$-S-CH$_2$CH$_2$CH$_2$-OH | 5 | >3 weeks |
| 7 | HO-CH$_2$CH$_2$CH$_2$-S-CH$_2$-S-CH$_2$CH$_2$CH$_2$-OH | >50 | >3 weeks |
| 8 | HOOC-CH$_2$-S-CH$_2$-S-CH$_2$-COOH | >50 | >3 weeks |
| 9 | (HOOC)(HOOCCH$_2$)CH-S-CH$_2$-S-CH(CH$_2$COOH)(COOH) | ~10 | >3 weeks |
| 10 | HOOC-CH$_2$-S-CH$_2$CH$_2$CH$_2$-S-CH$_2$-COOH | >50 | >3 weeks |
| 11 | HO$_3$S-CH$_2$CH$_2$-S-CH$_2$CH$_2$CH$_2$-S-CH$_2$CH$_2$-SO$_3$H | >50 | >3 weeks |
| 12 | HO$_3$S-CH$_2$CH$_2$CH$_2$-S-CH$_2$CH$_2$CH$_2$-S-CH$_2$CH$_2$CH$_2$-S-CH$_2$CH$_2$CH$_2$-SO$_3$H | >50 | >3 weeks |
| Comparative 1 | HO-CH$_2$CH$_2$-S-CH$_2$CH$_2$-S-CH$_2$CH$_2$-OH | 30-35 | <24 hours |
| Comparative 2 | HO-CH$_2$CH$_2$CH$_2$-S-CH$_2$-S-CH$_2$CH$_2$CH$_2$-OH | >50 | <1 week |

The presence of a precipitate in the stability test is evidence of decomposition of the sulfide compound. As can be seen from the above data, the present sulfide compounds have very good bath stability. The stability of the present compounds 6 and 7 is significantly better that of Comparatives 1 and 2. It has been surprisingly found that a hydroxyl substituent on a carbon atom that is at least gamma to a sulfur atom (that is, a hydroxyl group 3 or more carbons away from the sulfur atom) in the present sulfide compounds provides a significant improvement in the stability of silver and silver-alloy electroplating baths.

TABLE 2

| Compound | Structure |
|---|---|
| 13 | HOOC-CH(CH$_3$)-CH$_2$-S-CH$_2$-S-CH$_2$-CH(CH$_3$)-COOH |

TABLE 2-continued

| Compound | Structure |
|---|---|
| 14 | HO-C(CH2OH)(CH2OH)-CH2-S-CH2CH2-S-CH2-C(CH2OH)(CH2OH)-OH |
| 15 | (HO)2P(O)-CH2CH2-S-CH2CH2CH2-S-CH2CH2-P(O)(OH)2 |
| 16 | HO2C-CH(CH2OH)-CH2-S-CH2CH2-S-CH2-CH(OH)-CO2H |

EXAMPLE 15

Tin-silver (Sn—Ag) electroplating baths were prepared by combining 75 g/L tin from tin methanesulfonate, 0.4 g/L silver from silver methanesulfonate, 275 mL/L 70% methanesulfonic acid, 4 g/L ethoxylated bisphenol A (13 ethylene oxide units) as surfactant, 1 g/L ethyl maltol, 50 mg/L pentahydroxy flavone, 1 g/L hydroquinone monosulfonic acid potassium salt, a sulfide compound as a complexer, and DI water (balance). Table 3 shows the complexers used and their amounts. Sn—Ag bath 13-C uses the conventional complexer from U.S. Pat. Nos. 6,998,036 and 7,628,903.

TABLE 3

| Sn—Ag Bath | Sulfide Compound Complexer | Amount (mL/L) |
|---|---|---|
| 15-1 | 5 | 100 |
| 15-2 | 3 | 180 |
| 15-3 | 4 | 80 |
| 15-C | Comparative 1 | 65 |

Tin-Silver Wafer Bumping Test:

Sn—Ag solder bumps were electroplated on a 200 mm patterned silicon wafer using each of the above Sn—Ag electroplating baths in a NeXX plating tool. The patterned wafers had 75 μm diameter vias and 3 different pitch sizes (150, 225 and 375 μm), a platable area of 3-20%, a negative dry film resist height of 75 μm, and a seed of 1 kÅ Ti/3kÅ Cu. Copper studs with 5 μm in height are used as UBM layer to enhance adhesion between Sn—Ag solder bumps and the wafer. The wafers were plated vertically with rapid oscillation. Platinized titanium was used as an insoluble anode and current densities from 12 to 20 A/dm² were used.

The height of 11 bumps was measured on each wafer using a profilometer (KLA Tencor) to obtain within-die (WID) uniformity (or coplanarity) which was calculated by equation 1:

$$\text{Coplanarity}(\%) = \frac{h_{max} - h_{min}}{2h_{avg}} \times 100 \quad (1)$$

where $h_{max}$ is the height of the highest Sn—Ag bump in a die, $h_{min}$ is the height of the shortest Sn—Ag bump in a die, and $h_{avg}$ is the average height of Sn—Ag solder bumps. The smaller the coplanarity value (or within-die uniformity), the more uniform the Sn—Ag solder bumps. Uniformity of solder bumps is critical to ensuring proper attachment of components to the wafer.

Tin-silver layers were deposited on the wafers using each of the electroplating baths prepared above. The tin-silver deposits were analyzed to determine the co-planarity % (within-die uniformity) and for the formation of voids after reflow. The results of the analysis of the resulting solder bumps is shown in the Table 4.

TABLE 4

| | Sn—Ag Bath: | | | |
|---|---|---|---|---|
| | 15-2 | 15-2 | 15-3 | 15-C |
| Co-planarity % (within-die uniformity) | 21 | 19 | 25 | 20 |
| Void Formation | None | None | None | None |

As can be seen from the above data, the present sulfide compounds are useful as complexers in silver electroplating baths, providing void-free deposits.

After 2 weeks of storage at ambient temperature, none of Sn—Ag electroplating baths 13-1, 13-2 and 13-3 showed any decomposition or precipitation of the sulfide compound complexer.

EXAMPLE 16

The procedure of Example 15 is repeated except that the following surfactants and sulfide compound complexers are used. Surfactant A is an alkoxylated amine oxide of the formula

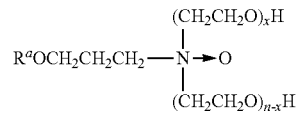

where $R^a$ is a $(C_9\text{-}C_{11})$alkyl, and Surfactant B is an EO/PO/EO copolymer having 20% EO groups, 80% PO groups and an average molecular weight of 2000 (Pluronic L61);

TABLE 5

| Sn—Ag Bath | Sulfide Compound | Amount (mL/L) | Surfactant |
|---|---|---|---|
| 16-1 | 6 | 90 | A |
| 16-2 | 8 | 125 | B |
| 16-3 | 9 | 75 | B |
| 16-4 | 11 | 100 | A |
| 16-5 | 15 | 110 | A |

What is claimed is:

1. An electroplating composition comprising: a bath-soluble source of silver ions; water; acid electrolyte; and a sulfide compound the formula:

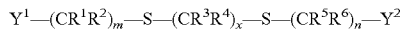

wherein $Y^1$ and $Y^2$ are independently chosen from $CO_2H$, $PO_3H_2$, and $CONR^7R^8$; each $R^1$, $R^2$, $R^5$ and $R^6$ is independently chosen from H, $(C_1$-$C_6)$alkyl, $CO_2H$, and hydroxy-substituted $(C_1$-$C_6)$alkyl; each $R^3$ and $R^4$ is independently chosen from H and $(C_1$-$C_6)$alkyl; m=1-6; n=1-6; $R^7$ and $R^8$ are independently chosen from H and $(C_1$-$C_3)$alkyl; and x=1-6; provided that when any of $R^1$, $R^2$, $R^5$ and $R^6$ is hydroxy-substituted $(C_1$-$C_6)$alkyl, the hydroxy group is bonded to a carbon atom that is at least gamma to a sulfur atom.

2. The composition of claim 1 further comprising a bath-soluble source of tin ions.

3. The composition of claim 1 wherein each $R^1$, $R^2$, $R^5$ and $R^6$ is independently chosen from H, $(C_1$-$C_4)$alkyl, $CO_2H$, and hydroxy-substituted $(C_1$-$C_4)$alkyl.

4. The composition of claim 1 wherein $Y^1$ and $Y^2$ are independently chosen from $CO_2H$, and $PO_3H_2$.

5. The composition of claim 1 wherein m=1-4.

6. The composition of claim 1 wherein n=1-4.

7. The composition of claim 1 wherein $Y^1$ and $Y^2$ are the same.

8. The composition of claim 1 wherein $Y^1$ and $Y^2$ are $CO_2H$; each $R^1$, $R^2$, $R^5$ and $R^6$ is independently chosen from H, $(C_1$-$C_3)$alkyl, and hydroxy-substituted $(C_1$-$C_3)$alkyl; each $R^3$ and $R^4$ is independently chosen from H and $(C_1$-$C_3)$alkyl; m=1-4; n=1-4; and x=1-4.

9. The composition of claim 1 further comprising an alkoxylated amine oxide surfactant of the formula:

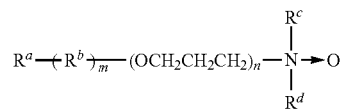

wherein $R^a$ is selected from a $(C_6$-$C_{22})$alkyl group and a substituted $(C_7$-$C_{22})$aryl group; $R^b$ is an alkoxylated unit; m is 0 to 7 and represents the number of moles of $R^b$; n is 0 or 1; and $R^c$ and $R^d$ are each at least one alkoxylated unit and the total number of alkoxylated units present in $R^c$ and $R^d$ is from 3 to 30.

10. A method of depositing a silver layer comprising: contacting a substrate with the composition of claim 1; and applying a potential for a period of time to deposit a silver-containing layer on the substrate.

* * * * *